United States Patent
Cheung

[11] Patent Number: 5,870,005
[45] Date of Patent: Feb. 9, 1999

[54] FREQUENCY MODULATED OSCILLATOR FOR TRANSMITTING SHORT RANGE SIGNALS

[76] Inventor: Shiu Hung Cheung, 17/F, Sincere Insurance Building, Hennessy Road, Wanchai, Hong Kong

[21] Appl. No.: 888,126

[22] Filed: Jul. 3, 1997

[51] Int. Cl.[6] .............................. H03C 3/00; H03B 5/18
[52] U.S. Cl. ..................... 332/130; 332/136; 332/141; 331/96; 331/107 SL; 331/117 D; 331/177 V; 455/111; 455/113; 455/129
[58] Field of Search .................... 332/130, 136, 332/141; 331/36 C, 96, 107 SL, 117 R, 117 FE, 117 D, 177 V; 455/110, 111, 113, 129

[56] References Cited

U.S. PATENT DOCUMENTS

| | | | |
|---|---|---|---|
| 3,590,382 | 6/1971 | Kenney | 325/36 |
| 3,723,906 | 3/1973 | Pedersen | 331/117 D |
| 3,927,316 | 12/1975 | Citta | 250/199 |
| 4,334,315 | 6/1982 | Ono et al. | 455/11 |
| 4,370,626 | 1/1983 | Ushida | 331/96 |
| 4,829,570 | 5/1989 | Schotz | 381/3 |
| 4,847,903 | 7/1989 | Schotz | 381/3 |
| 5,299,264 | 3/1994 | Schotz et al. | 381/14 |
| 5,410,735 | 4/1995 | Borchardt et al. | 455/42 |
| 5,432,858 | 7/1995 | Clair, Jr. et al. | 381/82 |
| 5,491,839 | 2/1996 | Schotz | 455/66 |

*Primary Examiner*—David Mis
*Attorney, Agent, or Firm*—Pollock, Vande Sande & Amernick

[57] ABSTRACT

A broadcast transmitter for generating low power modulated signals, especially for a wireless speaker system. A signal source such as a source of composite audio signals including left and right audio signals and a pilot signal are applied to a radio frequency signal oscillator. The radio frequency signal oscillator includes a bipolar transistor connected in a common base configuration, and having a stripline element as a frequency determinative component in the collector circuit of the bipolar transistor. The modulating signal is applied to the base of the bipolar transistor which modulates the collector junction capacitance of the transistor thereby frequency modulating the signal produced by the oscillator. Varactor tuning is provided for setting a nominal frequency of oscillation.

4 Claims, 5 Drawing Sheets

FREQUENCY MODULATED OSCILLATOR FOR TRANSMITTING SHORT RANGE SIGNALS

BACKGROUND OF THE INVENTION

The present invention relates to short range communications systems. Specifically, an oscillator circuit is provided for generating a radio frequency carrier signal frequency modulated with a composite information signal.

A number of systems have been developed to provide short range communications such as for wireless speaker operation in a stereophonic sound reproduction system. These systems generate a low power radio frequency signal modulated with stereophonic signals in the form of right and left audio signals. The low power radio frequency signal is broadcast to a receiver connected to the speakers avoiding the necessity to hard wire the speakers to the source of stereophonic signals.

The advantage of these systems is that the speakers may be located in virtually any short range from the source of audio signals without rewiring the speakers to the source. The low power radio frequency signals are in a frequency range of 900–928 MHz, as authorized by the FCC, and have a signal to noise ratio which maintains distortion at acceptable levels. Further, the devices must avoid the problem of microphonics and other adverse affects to quality. There is also the additional requirement that consumer electronics must be economical to build as price remains a significant factor in purchasing decisions.

SUMMARY OF THE INVENTION

It is an object of this invention to provide a low power radio frequency oscillator module which can be frequency modulated with a composite signal.

It is a more specific object of this invention to provide a low power modulated broadcast signal for transmitting stereophonic signals to remote pairs of speakers.

These and other objects are provided by a low power short range broadcast transmitter in accordance with the present invention. A composite signal such as left and right stereophonic audio signals, as well as a demodulating pilot signal are broadcast to a local receiver. A radio frequency signal is generated by a broadcast transmitter using a bipolar transistor operated in a grounded basic oscillator circuit. The signal source is connected to the base connection of the bipolar transistor. A stripline element exhibiting a resonant frequency in the UHF to microwave frequency spectrum, reserved for low power transmitters, is connected to the collector of the bipolar transistor. A feedback element connecting the collector to the emitter of the bipolar transistor provides for oscillation of the bipolar transistor at the resonant frequency of the stripline element.

The composite signal modulates the collector junction capacitance resulting in pulling of the resonant frequency as a function of the magnitude of the applied composite signal. Thus, a frequency modulation is effected for the radio frequency signal in accordance with the applied composite signal.

Tuning of the nominal oscillation frequency may be implemented using a varactor element or variable capacitor as part of the collector circuit, thus altering the collector impedance and hence the effective resonant frequency of the stripline element. Implementing the output circuit of the oscillator in a stripline configuration permits the addition of other stripline components, such as an R.F. filter for filtering spurious signals from the output signal.

DESCRIPTION OF THE PREFERRED EMBODIMENT

Figure 1:
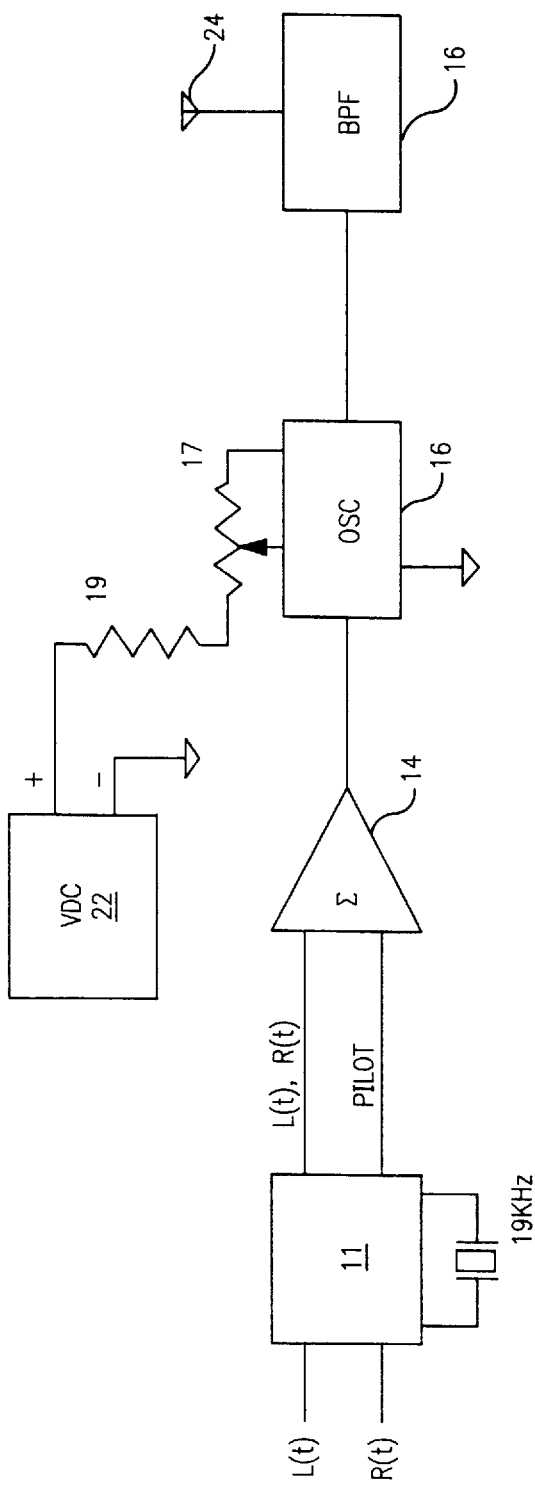
FIG. 1 is a block diagram illustrating a device for encoding a stereophonic audio signal, and for modulating the signal on a low power radio frequency signal in accordance with one embodiment of the invention.

FIG. 1 illustrates an overall block diagram of a transmitter for generating a low power radio frequency signal in a wireless speaker system. The system operates in the 900–928 MHz frequency spectrum. A stereophonic audio input signal comprising two channels, L and R is multiplexed in a standard FM multiplex format by the encoder 11. Encoder 11 creates a multiplexed left L(t) and right R(t) stereophonic signal, as well as a 19 KHz pilot signal which is used in conventional FM broadcast format to decode the multiplexed stereophonic audio signal. A signal combiner 14 combines the pilot signal with the encoded left and right stereophonic audio signals and applies the composite signal thereof to oscillator 16. The components comprising the encoder 11 and signal combiner 14 are standard stereophonic processing components known to those skilled in generating multiplexed stereophonic signals for broadcast. The composite signal frequency modulates the frequency of oscillator 16 from a nominal oscillation frequency of 900 MHz which is under control of the setting of potentiometer 17. Potentiometer 17 is connected in series with a resistor 19 to a source of DC voltage 22. By changing the setting of the potentiometer 17, the frequency can be shifted for the oscillator 16 as will be evident from the description of FIG. 2.

The low power radio frequency signal generated by the oscillator 16 is supplied to an R.F. filter 20 having a nominal frequency of 900 MHz. The bandwidth for the filter 20 is selected to be wide enough to accommodate the modulation sidebands for the carrier signal, and has a cut-off sufficient to eliminate second and higher order harmonics. The modulated radio frequency signal is effectively radiated by antenna 24.

Figure 2:
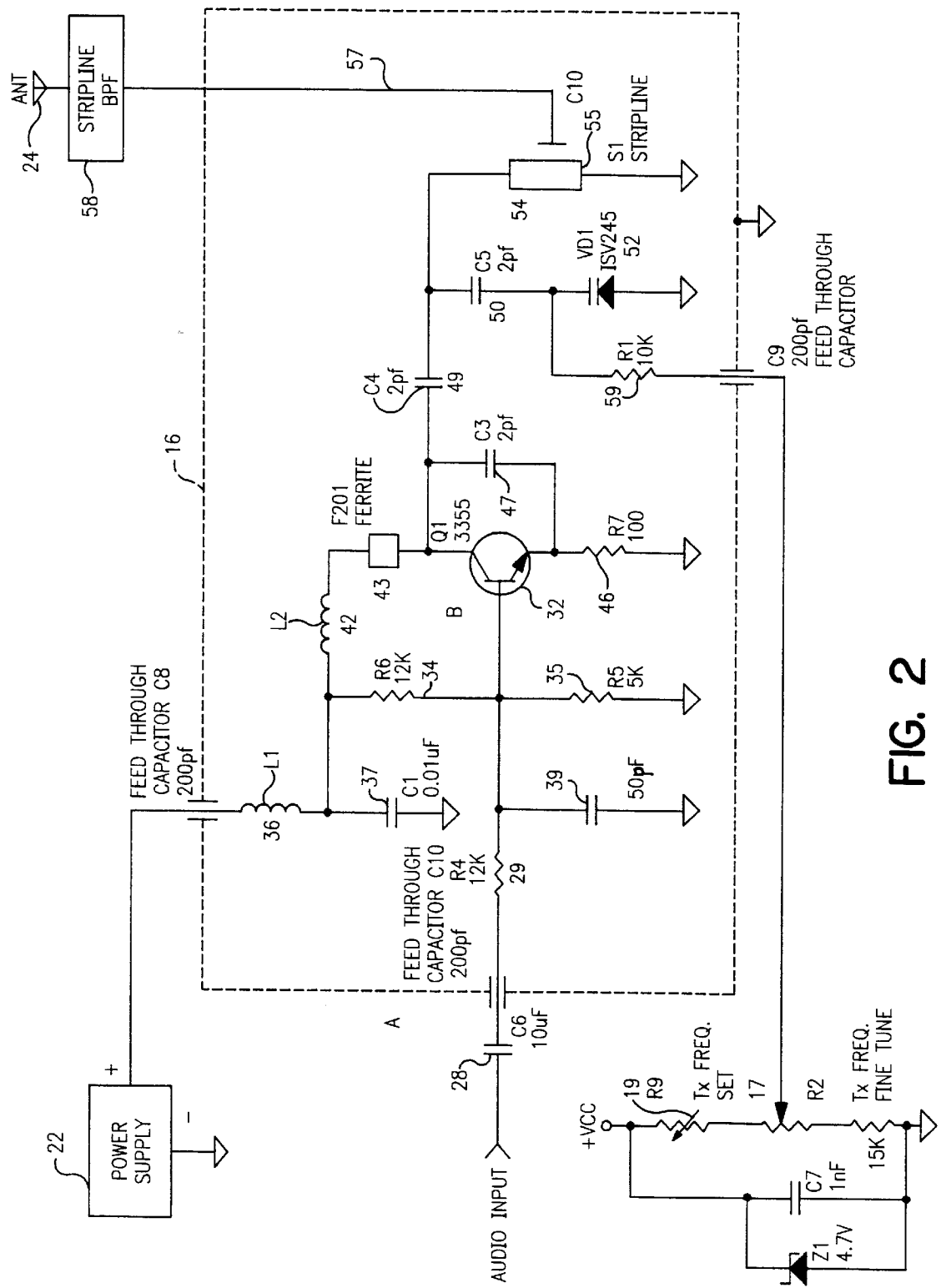
FIG. 2 illustrates the preferred embodiment of the low power radio signal generator.

The oscillator circuit 16 is shown more particularly in FIG. 2, as a grounded base bipolar transistor oscillator circuit. The bipolar transistor 32 is connected in a grounded base configuration by virtue of the capacitor 39. The d.c. bias voltage for the transistor 32 is established by resistors 34 and 35. A voltage source 22 is connected between the one side of a choke 36 and a ground connection for the circuit. The collector circuit includes a resonant element 54 which is formed in a stripline package comprising an etched circuit element. The resonant stripline element 54 is capacitably coupled to the collector through a capacitor 49. A d.c. potential is applied to the collector of transistor 32 through a choke 42 and a ferrite choke 43. The ferrite choke 43 keeps the microwave frequency from being coupled back through the power supply 22 or into the base of the transistor 32. Choke 36 and capacitor 37 also serve to maintain any residual R.F. signal and any composite audio signal entering through capacitor 28 from being coupled to the power supply 22.

Feedback for the oscillator circuit is established through capacitor 47. Capacitor 47 connects the collector of transistor 32 to the emitter, and an emitter resistor 46 establishes a return connection for the transistor 32 to the power supply 22.

A nominal frequency of operation is established by the resonant frequency of the stripline component 54 as modified by the varactor 52 or variable capacitor impedance. The varactor 52 is connected through a capacitor 50 as a parallel element to the stripline circuit 54. By changing the voltage applied to varactor 52 through a resistor 19 connected to the potentiometer 17, it is possible to shift the resonant frequency of the resonance stripline assembly of 54, 52, and also the transistor 32 collector parameter which shifts the frequency of oscillation for the device.

The modulating signal is applied through capacitor 28 and resistor 29 to the base of transistor 32. Capacitor 28 and resistor 29 provide audio frequency shaping for the composite input signal. The composite input signal modulates the collector base capacitance of the transistor 32, shifting the frequency of resonance of the collector circuit. The shift in frequency is proportional to the applied instantaneous amplitude of the composite input signal and constitutes an FM modulated signal.

A coupling member 55 associated with the stripline resonator 54 provides an output signal to the R.F. filter 58, also configured in stripline. An antenna connection is provided on the output of the stripline filter 58 for applying the signal to an antenna 24 which radiates a broadcast signal to a receiver associated with the pair of speakers.

The receiver may be of conventional design, such as a double conversion superhetrodyne receiver wherein the frequency modulated low power radio frequency signal is demodulated through a first and second stage of conversion. The resulting signal, preferably centered at an intermediate frequency of 10.7 MHz, may be applied to a standard MPX decoder for generating left and right audio signals from the detected 19 KHz pilot signal.

Figures 3A, 3B:
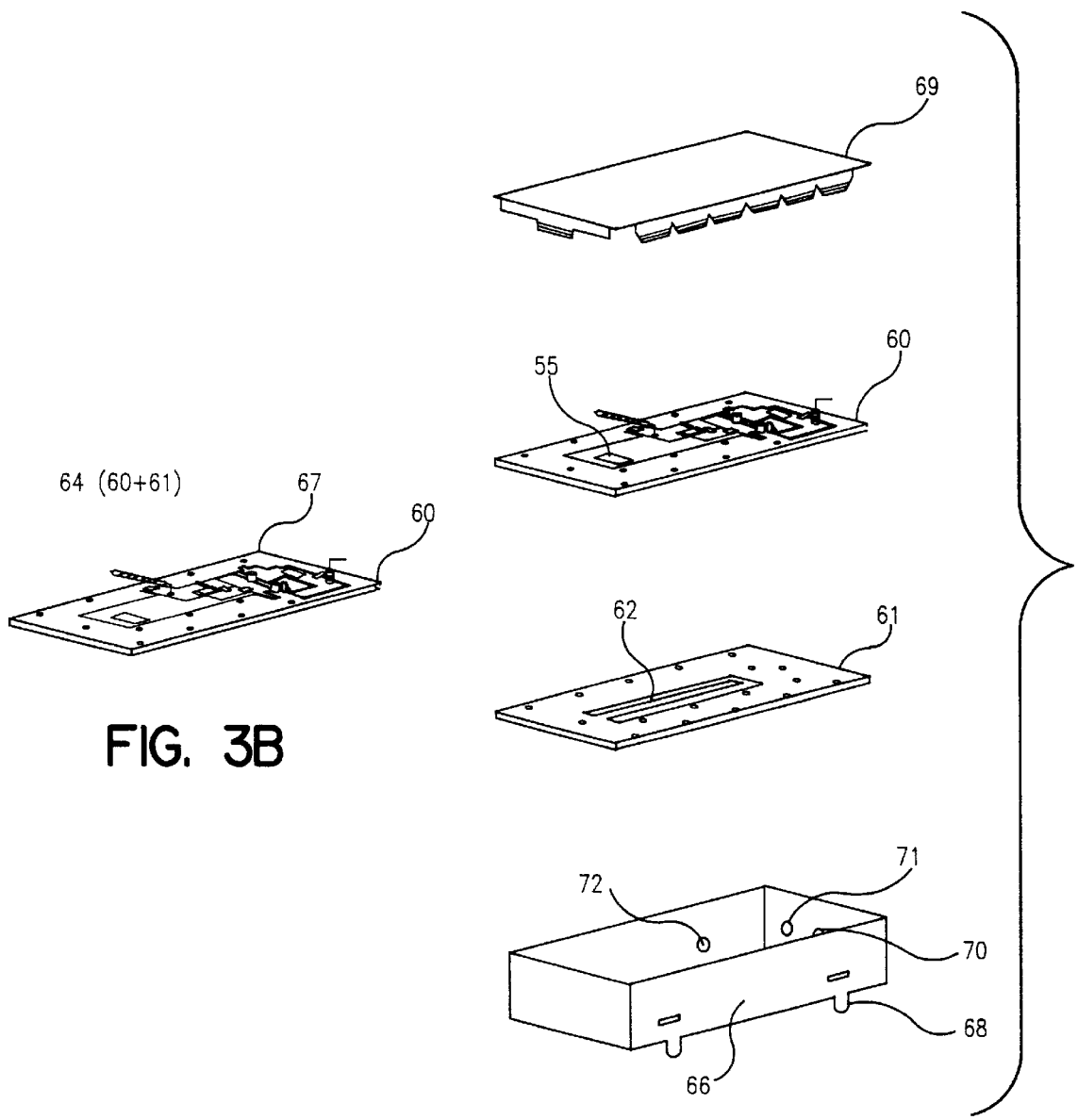
FIG. 3A illustrates the mechanical packaging for the system of FIG. 2.
FIG. 3B illustrates the assembly 64 of FIG. 3A.

The foregoing transmitter circuit may be packaged conveniently as shown in FIG. 3A. A basic component printed circuit board 60 supports the discrete components for the oscillator 16. A second printed circuit board 61 includes a stripline resonator 62. 63 represents an area of removed conductor within the upper printed circuit board bearing the discrete components in alignment with the etched stripline resonator 62. When packaged together to form an assembly 64 as shown in FIG. 3B, the assembly will form a base for metal case 66. The metal case 66 and cover 69 are used to provide RF screening for the oscillator circuit assembly and also encapsulating the entire circuit to form a tight RF screen package module. Tab 68 of the metal case is received in the final equipment mother board for good electrical earth bonding of the oscillator module case on to the main equipment signal ground. Those plated through holds 65 are also aligned with a metal ground plan on both printed circuit board 60 and 61, and solder thereto. Feed through connectors with integrated built in capacitors C8, C9 and C 10 are installed to 70, 71 and 72 of the meal case 66. The two feed through connectors 70 and 71 are provided for B+ supply line to the module unit from the main mother board and meanwhile the other one is connecting the frequency tuning d.c. voltage from R2 potentiometer 17. The output coaxial cable is connecting from C5 capacitor together with 19 KHz pilot control carrier applied to R4 via the other feed through capacitor C10 and finally on Q1 3355 base input circuit to create a frequency modulation output RF signal at 900 MHz.

Figure 3C:
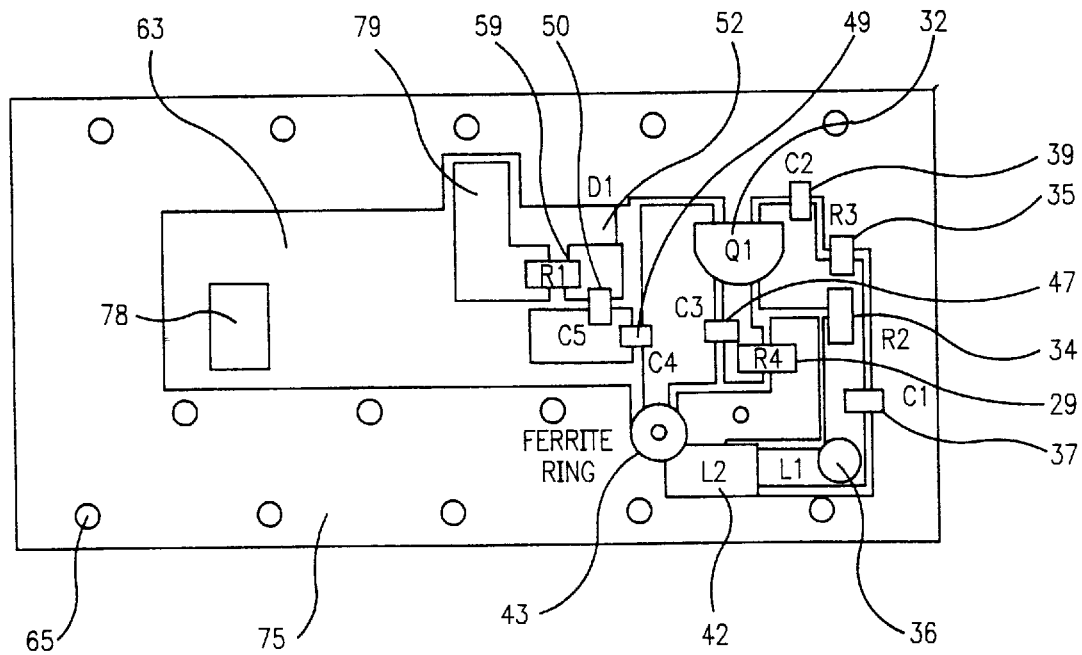
FIG. 3C illustrates the circuit board 60 of the assembly 64.
Figure 3D:
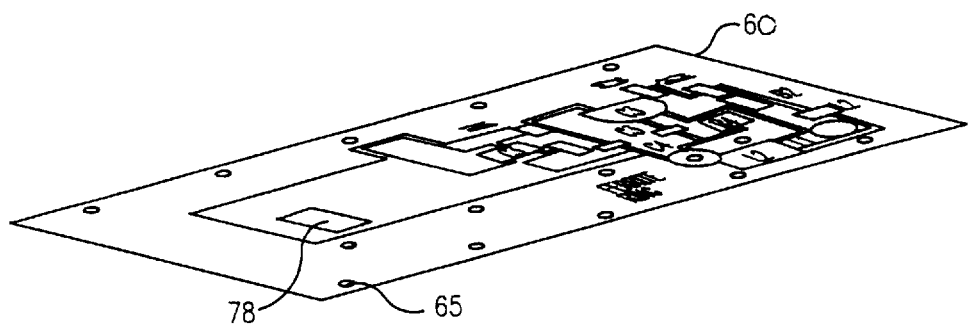
FIG. 3D illustrates an oblique view of the circuit board 60.
Figure 3E:
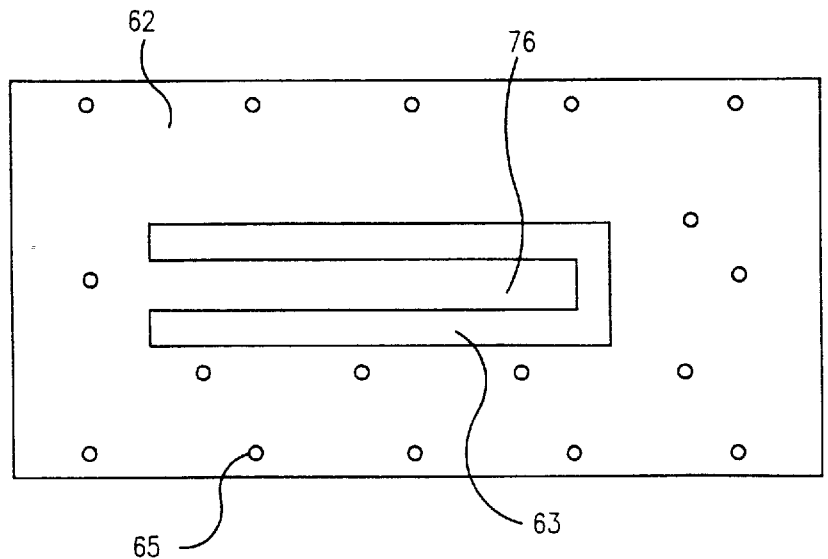
FIG. 3E illustrates the stripline resonator 61 of the assembly 64.
Figure 3F:
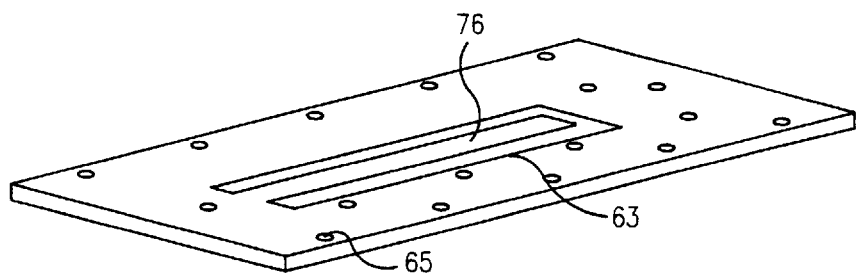
FIG. 3F illustrates an oblique view of the stripline resonator of FIG. 3 E.

FIGS. 3E and 3F illustrate the resonator 62, and FIG. 3C and 3D illustrate the printed circuit board 60 in detail. The large area denoted 63 is that portion of the circuit board 60 which has the conducting copper removed. The remaining copper 65 around the perimeter of the circuit board 60 provides a ground plane. When the resonator 62 of FIG. 3D is in registry with the circuit board 60, the junctions of capacitor 49 and capacitor 50 is connected to the end 76 of the stripline resonator. Power output is taken from conductive pad 78. The control voltage for controlling the frequency enters through connector 79 which is connected to the resistor 59 and varactor 52. Thus, there is described a low power radio frequency transmitter for generating a frequency modulated 900 MHz signal for a wireless speaker system. While the transmitter has been illustrated for use in wireless speaker systems, other uses will be evident to those skilled in the art, in accordance with the claims which follow.

What is claimed is:

1. A broadcast transmitter for generating a low power modulated signal comprising:

a source of composite signals;

a bipolar transistor receiving said composite signals on a base thereof, having a collector connected to a stripline element exhibiting a resonance at a frequency within a wireless frequency band, and a feed back element connecting said collector to an emitter of said transistor which is in turn connected to a common terminal through a resistor, said base being capacitively connected to said common terminal;

means connected to provide a d.c. voltage between said collector and said common terminal; and biasing means connected to said base for providing a bias current to said transistor wherein said transistor oscillates in a grounded base mode and the collector junction capacitance of said transistor changes in response to said composite signals correspondingly changing the frequency of oscillation.

2. The broadcast transmitter of claim 1 further comprising a varactor element connected in parallel with said stripline element, said varactor element being connected to a source of tuning voltage for setting a nominal frequency of oscillation.

3. The broadcast transmitter of claim 1 further comprising a stripline bandpass filter connected to said stripline element.

4. The broadcast transmitter of claim 1 wherein said source of composite signals provides stereophonic related signals and a pilot signal.

* * * * *